(12) United States Patent
Kim et al.

(10) Patent No.: US 9,500,890 B2
(45) Date of Patent: Nov. 22, 2016

(54) METHOD OF MANUFACTURING DEVICE SUBSTRATE AND DISPLAY DEVICE MANUFACTURED USING THE SAME

(71) Applicant: SAMSUNG DISPLAY CO., LTD., Yongin, Gyeonggi-Do (KR)

(72) Inventors: TaeHwan Kim, Gyeonggi-do (KR);
Myeonghee Kim, Gyeonggi-do (KR);
Youngbae Kim, Gyeonggi-do (KR);
Jong Seong Kim, Seoul (KR);
Myunghwan Park, Gyeonggi-do (KR);
Jonghwan Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/300,397

(22) Filed: Jun. 10, 2014

(65) Prior Publication Data
US 2015/0138494 A1    May 21, 2015

(30) Foreign Application Priority Data
Nov. 15, 2013    (KR) ......................... 10-2013-0139186

(51) Int. Cl.
*H01L 21/02* (2006.01)
*G02F 1/1333* (2006.01)
*H01L 27/12* (2006.01)

(52) U.S. Cl.
CPC ....... *G02F 1/133305* (2013.01); *H01L 27/124* (2013.01); *H01L 27/1262* (2013.01); *G02F 2202/22* (2013.01); *H01L 21/02038* (2013.01); *H01L 21/02172* (2013.01); *H01L 21/02296* (2013.01)

(58) Field of Classification Search
CPC .................... H01L 21/02104; H01L 21/02296; H01L 21/02038; H01L 21/02172
See application file for complete search history.

(56) References Cited

U.S. PATENT DOCUMENTS

| | | | |
|---|---|---|---|
| 7,696,058 B2 * | 4/2010 | Kakehata et al. ............ 438/406 |
| 2002/0042198 A1 * | 4/2002 | Bjarnason et al. ........... 438/689 |
| 2008/0135175 A1 | 6/2008 | Higuchi | |
| 2011/0026236 A1 | 2/2011 | Kondo et al. | |
| 2011/0045239 A1 | 2/2011 | Takaya et al. | |
| 2011/0048611 A1 | 3/2011 | Carre et al. | |
| 2012/0118478 A1 * | 5/2012 | Park et al. ...................... 156/67 |
| 2014/0060575 A1 * | 3/2014 | Lee et al. .......................... 134/4 |
| 2014/0242318 A1 * | 8/2014 | Su et al. ..................... 428/41.8 |

FOREIGN PATENT DOCUMENTS

| | | |
|---|---|---|
| JP | 08086993 | 4/1996 |
| JP | 2000241804 | 9/2000 |

(Continued)

*Primary Examiner* — John C Ingham
(74) *Attorney, Agent, or Firm* — F. Chau & Associates, LLC

(57) ABSTRACT

The method of manufacturing a device substrate includes forming a surface modifying layer on a process substrate. The surface modifying layer has a different hydrophobicity from that of the process substrate. The process substrate is disposed on a carrier substrate. The surface modifying layer is disposed between the process substrate and the carrier substrate. A device is formed on the process substrate. The process substrate is separated from the carrier substrate.

26 Claims, 18 Drawing Sheets

(56) References Cited

FOREIGN PATENT DOCUMENTS

| | | |
|---|---|---|
| JP | 2005209756 | 8/2005 |
| JP | 2005216887 | 8/2005 |
| JP | 2005338281 | 12/2005 |
| JP | 2007326358 | 12/2007 |
| JP | 2008158464 | 7/2008 |
| JP | 2009164172 | 8/2009 |
| JP | 2010018505 | 1/2010 |
| JP | 2011162432 | 8/2011 |
| JP | 2011183792 | 9/2011 |
| JP | 2011184284 | 9/2011 |
| JP | 2012086527 | 5/2012 |
| KR | 1020080060124 | 7/2008 |
| KR | 20110063800 | 6/2011 |
| KR | 1020110131223 | 12/2011 |
| KR | 1020120050581 | 5/2012 |
| KR | 20120059512 | 6/2012 |
| KR | 1020120069608 | 6/2012 |
| KR | 1020120099018 | 9/2012 |
| KR | 1020120106659 | 9/2012 |
| KR | 1020120136877 | 12/2012 |
| WO | 2007018028 | 2/2007 |
| WO | 2009128359 | 10/2009 |
| WO | 2010090147 | 8/2010 |
| WO | 2010110087 | 9/2010 |

\* cited by examiner

Fig. 12A
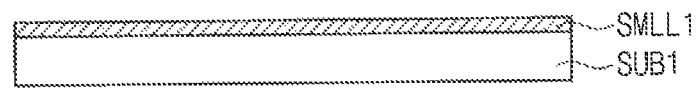
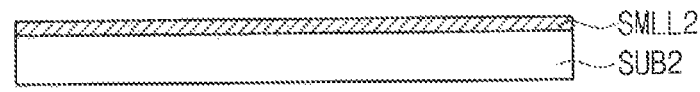
Fig. 12B
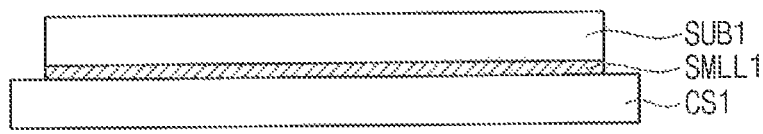
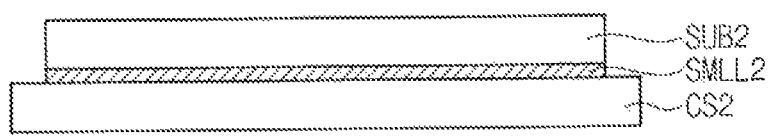

Fig. 14A
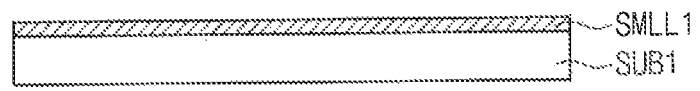
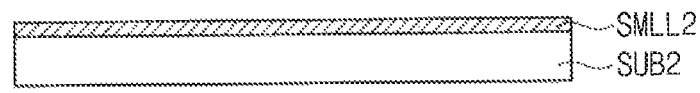
Fig. 14B
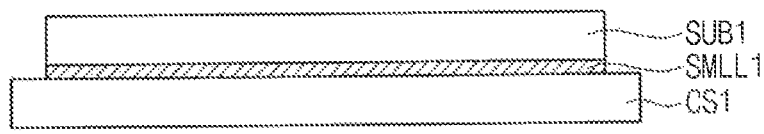
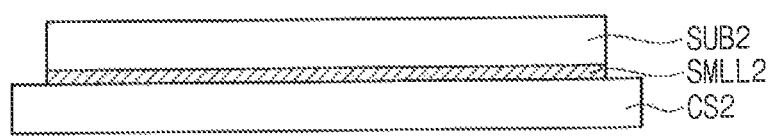

Fig. 14C
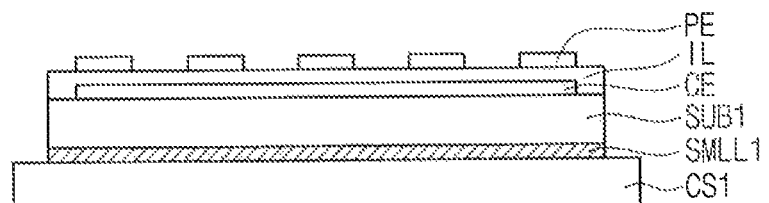
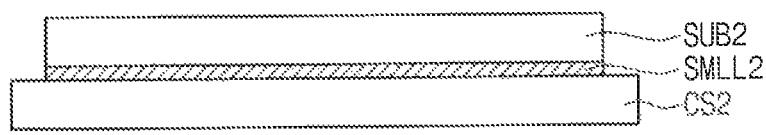
Fig. 14D
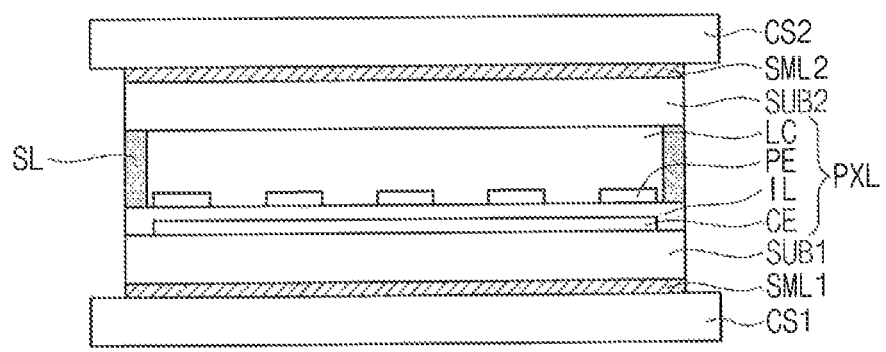

METHOD OF MANUFACTURING DEVICE SUBSTRATE AND DISPLAY DEVICE MANUFACTURED USING THE SAME

CROSS-REFERENCE TO RELATED APPLICATION

This U.S. non-provisional patent application claims priority under 35 U.S.C. §119 to Korean Patent Application No. 10-2013-0139186, filed on Nov. 15, 2013, in the Korean Intellectual Property Office, the disclosure of which is incorporated by reference herein in its entirety.

TECHNICAL FIELD

Exemplary embodiments of the present inventive concept relate to a device substrate, and more particularly to a method of manufacturing a device substrate and a display device manufactured using the same.

DISCUSSION OF RELATED ART

Display devices using flat display panels (e.g., a liquid crystal display (LCD) panel, a field emission display (FED) panel, a plasma display panel (PDP), or an organic light-emitting diode (OLED) panel) may be applied to televisions and/or mobile phones. Display devices may be manufactured using inflexible glass substrates. Research has been conducted for manufacturing flexible display devices. For example, a flexible material (e.g., plastic) may be substituted for a conventional glass substrate not having flexibility and may be used in bent or curved display devices.

SUMMARY

Exemplary embodiments of the present inventive concept provide methods of manufacturing a flexible device substrate and display devices manufactured using the same.

According to an exemplary embodiment of the present inventive concept, a method of manufacturing a device substrate includes forming a surface modifying layer on a process substrate. The surface modifying layer has a hydrophobicity different from a hydrophobicity of the process substrate. The method includes disposing the process substrate on a carrier substrate. The surface modifying layer is disposed between the process substrate and the carrier substrate. The method includes forming a device on the process substrate, and separating the process substrate from the carrier substrate.

The hydrophobicity of the surface modifying layer may be greater than the hydrophobicity of the process substrate.

The surface modifying layer may include a silane compound. The silane compound may include hexamethyldisiloxane (HMDS).

Forming the surface modifying layer may include forming a silane compound layer including self-assembled monolayer on the process substrate, and cleaning the process substrate.

The surface modifying layer may include a metal oxide. The metal oxide may include indium-zinc oxide (IZO), indium-tin oxide (ITO), indium-tin-zinc oxide (ITZO), or germanium-zinc oxide (GZO).

The surface modifying layer may include a silane compound layer disposed on the process substrate. The silane compound layer may include a silane compound. A metal oxide layer may be disposed between the process substrate and the silane compound layer. The metal oxide layer may include a metal oxide.

The surface modifying layer may be disposed on at least a portion of the process substrate when viewed from a plan view. The process substrate may include: a first region on which the surface modifying layer is disposed and a second region on which the surface modifying layer is not disposed. The second region may be disposed along an edge of the process substrate. The first region may be disposed on a portion of an edge of the process substrate. The first region may pass through a center of the process substrate and may extend in a direction parallel to a side of the process substrate.

A portion of the surface modifying layer may be removed. The portion of the surface modifying layer may be removed by an etching process or a grinding process.

According to an exemplary embodiment of the present invention, a display device includes a first substrate having a first surface and a second surface opposite to each other. A pixel is disposed on the first surface. A first surface modifying layer is disposed on the second surface. The first surface modifying layer has a hydrophobicity different from that of the first substrate.

The display device may further include a second substrate having a third surface facing the first substrate and a fourth surface opposite to the third surface. A second surface modifying layer may be disposed on the fourth surface. The second surface modifying layer may have a hydrophobicity different from that of the second substrate.

The second surface modifying layer may include a metal oxide layer. The metal oxide layer may include a metal oxide.

The surface modifying layer may be grounded.

BRIEF DESCRIPTION OF THE DRAWINGS

The above and other features of the present inventive concept will become more apparent by describing in detail exemplary embodiments thereof, with reference to the accompanying drawings in which:

FIGS. 12A to 12E are cross-sectional views showing a method of manufacturing the display device illustrated in FIG. 11;

FIGS. 14A to 14E are cross-sectional views showing a method of manufacturing the display device illustrated in FIG. 13.

DETAILED DESCRIPTION OF THE EMBODIMENTS

Figure 1:
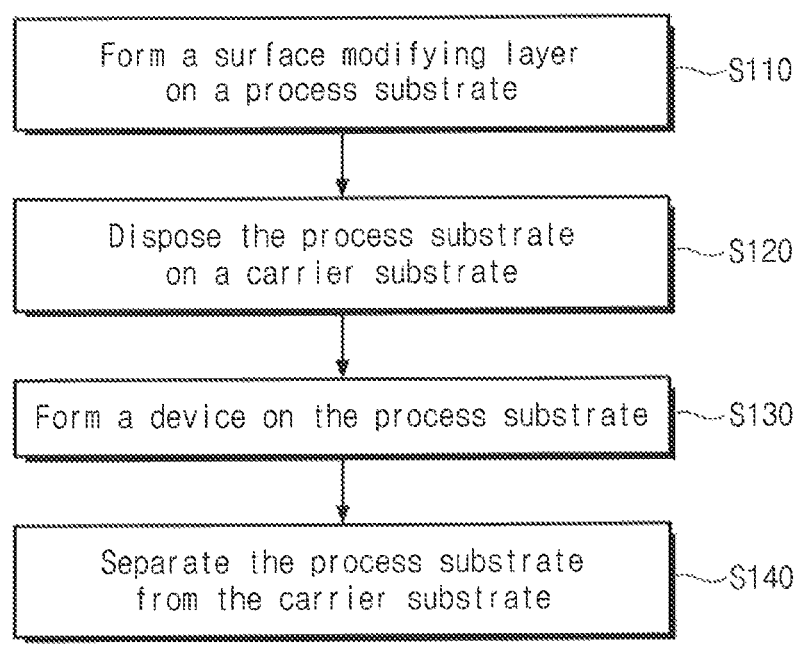
FIG. 1 is a flowchart showing a method of manufacturing a device substrate according to an exemplary embodiment of the present inventive concept.

Exemplary embodiments of the present inventive concept will now be described more fully hereinafter with reference to the accompanying drawings, in which exemplary embodiments are shown. The aspects and features of the present inventive concept will be apparent from the following exemplary embodiments that will be described in more detail with reference to the accompanying drawings. It should be noted, however, that the inventive concept is not limited to the following exemplary embodiments, and may be implemented in various forms. In the drawings, exemplary embodiments of the present inventive concept are not limited to the specific examples provided herein.

The terminology used herein is for the purpose of describing exemplary embodiments and is not intended to limit the present inventive concept. It will be understood that when an element is referred to as being "connected" or "coupled" to another element, it may be directly connected or coupled to the other element or intervening elements may be present.

It will be understood that when an element such as a layer, region or substrate is referred to as being "on" another element, it can be directly on the other element or intervening elements may be present. In contrast, the term "directly" means that there are no intervening elements Shapes of the exemplary views may be modified according to manufacturing techniques and/or allowable errors. The exemplary embodiments of the present inventive concept are not limited to the specific shapes illustrated in the exemplary views, but may include other shapes that may be created according to manufacturing processes. Areas exemplified in the drawings may have general properties, and may be used to illustrate specific shapes of elements. Thus, this should not be construed as limiting to the scope of the present inventive concept.

It will be also understood that although the terms first, second, third etc. may be used herein to describe various elements, these elements should not be limited by these terms. These terms may be used to distinguish one element from another element. Thus, a first element in exemplary embodiments of the present inventive concept could be termed a second element in other embodiments without departing from the teachings of the present inventive concept. Exemplary embodiments of aspects of the present inventive concept explained and illustrated herein may include their complementary counterparts. The same reference numerals or the same reference designators may denote the same elements throughout the specification.

Exemplary embodiments may be described herein with reference to cross-sectional illustrations and/or plane illustrations that may be idealized exemplary illustrations. Variations from the shapes of the illustrations as a result, for example, of manufacturing techniques and/or tolerances, may occur. Exemplary embodiments of the present inventive concept should not be construed as limited to the shapes of regions illustrated herein but are to include deviations in shapes that may result, for example, from manufacturing. For example, an etching region illustrated as a rectangle may have rounded or curved features. Thus, the regions illustrated in the figures are schematic in nature and their shapes might not illustrate the actual shape of a region of a device and are not intended to limit the scope of example embodiments of the present inventive concept.

FIG. 1 is a flowchart showing a method of manufacturing a device substrate according to an exemplary embodiment of the present inventive concept. FIGS. 2A to 2D are cross-sectional views showing a method of manufacturing a device substrate according to an exemplary embodiment of the present inventive concept. Hereinafter, a method of manufacturing a device substrate according to exemplary embodiments of the present inventive concept will be described with reference to FIGS. 1 and 2A to 2D.

Referring to FIG. 1, a device substrate according to exemplary embodiments of the present inventive concept may be manufactured by forming a surface modifying layer SML on a process substrate PS (S110), disposing the process substrate PS on a carrier substrate CS with the surface modifying layer SML therebetween (S120), forming a device on the process substrate PS (S130), and separating the process substrate PS from the carrier substrate CS (S140).

Figure 2A:
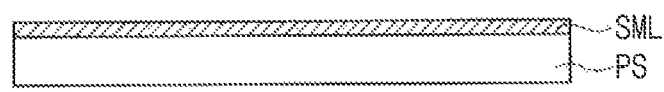
FIGS. 2A to 2D are cross-sectional views showing a method of manufacturing a device substrate according to an exemplary embodiment of the present inventive concept.

Referring to FIGS. 1 and 2A, the process substrate PS on which the device may be formed may be provided and the surface modifying layer SML may be formed on the process substrate PS.

The process substrate PS may have a plate-shape including a first surface provided with the device and another surface opposite to the first surface. The process substrate PS may have various shapes, for example, when viewed from a plan view. For example, the shape of the process substrate PS may include a round shape, a rectangular shaper, a parallelogram-shaper, a shape having a curved edge (e.g., a circular shape or an elliptical shape), or an irregular shape. The process substrate PS may be any size.

The process substrate PS may include glass, crystal, organic/inorganic polymer material, and/or fiber reinforced plastics. The process substrate PS may include a rigid substrate. At least a portion of the process substrate PS may include a flexible substrate. For example, the entire process substrate PS may be flexible. According to exemplary embodiments of the present inventive concept, a portion of the process substrate PS may be flexible and a portion of the process substrate PS might not be flexible. For example, the process substrate PS may include a flexible region and a rigid region that is inflexible. The terms "flexible," "inflexible" and "rigid" mean or show relative properties of a flexible region and a rigid region of the process substrate PS. Thus, even though the terms "inflexible" and "rigid" may be used, the rigid region may be hard and without any flexibility or may simply be less flexible than that of the flexible region.

In exemplary embodiments of the present inventive concept, the polymer material may include polyethylene terephthalate (PET), poly(ethylene naphthalate) (PEN), polyether sulfone (PES), polycarbonate (PC), polysulfone, phenolic resin, epoxy resin, polyester, polyimide, polyetherester, polyetheramide, cellulose acetate, aliphatic polyurethanes, polyacrylonitrile, polytetrafluoroethlenes, polyvinylidene fluorides, poly(methyl(x-methacrylates)), aliphatic or cyclic polyolefin, polyarylate, polyetherimide, polyimide, fluoropolymer (e.g., teflon), poly(ehterether ketone), poly(ether ketone), poly (ethylene tetrafluoroethylene) fluoropolymer, poly(methyl methacrylate), and/or acrylate/methacrylatecopolymers.

The surface modifying layer SML may be provided on a first surface of the process substrate PS. The surface modifying layer SML may include a material having surface energy different from that of the process substrate PS. For example, the surface modifying layer SML may include a material having a hydrophobicity greater than that of the process substrate PS.

The surface modifying layer SML may include a silane compound layer including a silane compound. The silane compound layer may be a self-assembled monolayer type.

A pre-treatment process may be performed on the process substrate PS, and a self-assembled monolayer may be formed on the process substrate PS and the process substrate PS may be cleaned to form the silane compound layer.

The process substrate PS may be partially oxidized by the pre-treatment process before the surface of the process substrate PS is modified. The pre-treatment process may be performed in order to increase reactivity in a subsequent modifying reaction. In exemplary embodiments of the present inventive concept, the surface of the process substrate PS may be treated by ultraviolet rays, oxygen ($O_2$) plasma and/or ozone ($O_3$) plasma during the pre-treatment process. In the plasma treatment process, the process substrate PS may be inserted into a decompressed chamber and oxygen ($O_2$) and/or ozone ($O_3$) may be injected into the chamber by a plasma injector for a predetermined time in a range of, for example, from about 30 seconds to about 1 minute.

An —OH group having high reactivity may be formed on the surface of the process substrate PS, which is treated by the ultraviolet rays, oxygen ($O_2$) and/or ozone ($O_3$). The —OH group may facilitate the formation of the subsequent self-assembled monolayer and may increase an adhesive strength between the self-assembled monolayer and the process substrate PS. Intensity and an irradiating time of the ultraviolet rays may be changed depending on a material of the process substrate PS.

The pre-treatment process may be omitted, for example, according to physical properties of the process substrate PS. For example, if the surface of the process substrate PS has a reactive group capable of sufficiently reacting with the silane compound, the pre-treatment process may be omitted.

The self-assembled monolayer may be formed by providing a compound having a functional group capable of reacting with the surface of the process substrate PS to the process substrate PS. The functional group may be bonded to the surface of the process substrate PS in a covalent bond manner, a hydrogen bond manner, or a chemical adsorption manner. The compound may be two-dimensionally self-aligned on the surface of the process substrate PS by the functional group.

The silane compound constituting the self-assembled monolayer may have a structural formula expressed by the following chemical formula 1.

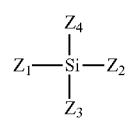

[Chemical formula 1]

In the chemical formula 1, each of "$Z_1$", "$Z_2$", "$Z_3$" and "$Z_4$" is —H, —$CH_3$, —Cl, —$OCH_3$, —$OCH_2CH_3$, —$OCOCH_3$, or —$OCH_2CH_2CH_3$ except in the cases that all "$Z_1$", "$Z_2$", "$Z_3$" and "$Z_4$" are —H or —$CH_3$, and "$Z_1$", "$Z_2$", "$Z_3$" and "$Z_4$" consist of only —H and —$CH_3$. In exemplary embodiments of the present inventive concept, the silane compound includes polymethyldisiloxane (PMDS). The polydimethylsiloxane having suitable molecular weight may be selected as the silane compound.

The self-assembled monolayer may include a silane compound in a liquid state or a vapor state.

A method of forming the self-assembled monolayer using the silane compound of the liquid state will be described hereinafter in more detail. A solution including the silane compound may be prepared and the solution including the silane compound may be applied to the process substrate PS to form the self-assembled monolayer. The solution including the silane compound may include water. The water may be used as a catalyzer.

A method of forming the self-assembled monolayer using the silane compound in the vapor state will be described hereinafter in more detail. The process substrates PS and the silane compound may be inserted into a vacuum chamber having a low pressure (e.g., about 500 Pa or less), and the self-assembled monolayer may be formed. The vacuum chamber may maintain its inner temperature and inner pressure and evaporate the silane compound. After air in the vacuum chamber is exhausted to the outside of the vacuum chamber, water vapor may be inputted into the vacuum chamber and the silane compound may self-assemble on the process substrate PS. The water vapor may be used as a catalyzer. The amount of the inputted water vapor may be controlled to maintain the inside of the chamber at a pressure of about 500 Pa.

Liquid or vapor silanization using the water as the catalyzer may be expressed by the following chemical formula 2. For the purpose of ease and convenience in explanation, the following chemical formula 2 shows an example where "$Z_1$" is a hydrogen atom and all "$Z_2$", "$Z_3$" and "$Z_4$" are —Cl. A block of the following chemical formula 2 illustrates the process substrate PS.

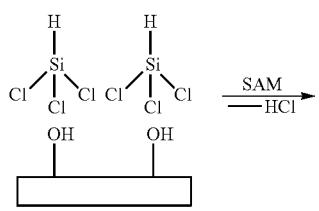

[Chemical formula 2]

-continued

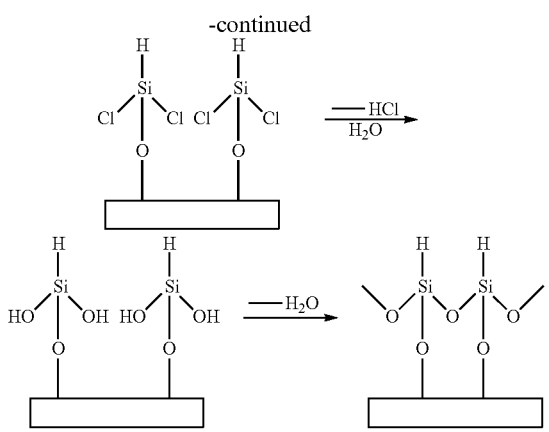

Mechanism of the liquid or vapor silanization not using the water as the catalyzer is expressed by the following chemical formula 3. For the purpose of ease and convenience in explanation, the following chemical formula 3 shows an example case that "$Z_1$" is a hydrogen atom, "$Z_2$" and "$Z_4$" are —$CH_3$, and "$Z_3$" is —$OCH_3$. A block of the following chemical formula 3 illustrates the process substrate PS.

[Chemical formula 3]

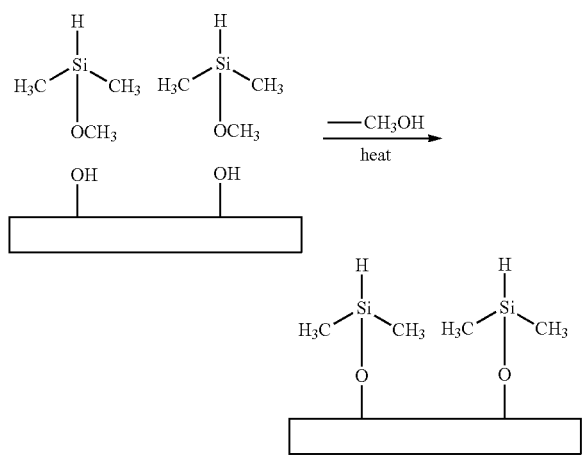

After the monolayer is self-assembled on the process substrate PS, the process substrate PS may be cleaned. The process substrate PS may be cleaned using deionized water or pure water as a cleaning solution. The cleaning process may remove an excess of the silane compound having a functional group, the silane compound unreacted with a functional group of the surface of the process substrate PS and/or other impurities. A non-uniformly aligned or stacked portion of the silane compound may be removed by the cleaning process. Thus, the silane compound may form a uniform monolayer on the entire portion of the process substrate PS.

As described above, the self-assembled monolayer may be formed by the liquid deposition method or the vapor deposition method. However, the present inventive concept is not limited thereto.

Figure 2B:
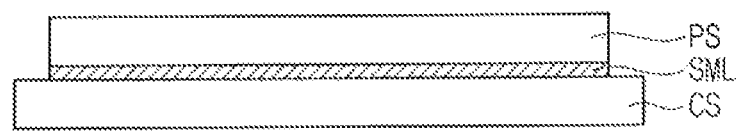

Referring to FIGS. 1 and 2B, the process substrate PS may be disposed on the carrier substrate CS. The process substrate PS may be disposed on a top surface of the carrier substrate CS. A fixing part (not shown, e.g., a clip) for fixing the process substrate PS may be provided on the carrier substrate CS. The process substrate PS may be fixed to the carrier substrate CS by the fixing part.

The carrier substrate CS may support the process substrate PS. The carrier substrate CS may be a size that is equal to or greater than that of the process substrate PS. The carrier substrate CS may have an area that is less than that of the process substrate PS. The carrier substrate CS may be of a size that is capable of stably fixing and supporting the process substrate PS. The size of the carrier substrate CS is not specially limited thereto, and the carrier substrate CS may be any desired size.

The carrier substrate CS may include glass, crystal, organic/inorganic polymer material, and/or fiber reinforced plastics. In exemplary embodiments of the present inventive concept, the carrier substrate CS may be formed of glass.

The carrier substrate CS may be a rigid substrate that is inflexible. However, the present inventive concept is not limited thereto. In exemplary embodiments of the present inventive concept, at least a portion of the carrier substrate CS may include a flexible substrate.

A surface of the process substrate PS may be in contact with a surface of the carrier substrate CS. In an exemplary embodiment of the present inventive concept, the process substrate PS might not be chemically combined with the carrier substrate CS. An additional layer such as an adhesive layer or a glue layer might not be disposed between the process substrate PS and the carrier substrate CS; however, an air layer may be disposed between the process substrate PS and the carrier substrate CS. The process substrate PS and the carrier substrate CS may be separated from each other by external force without damaging the process substrate PS or the carrier substrate CS.

The surface of the process substrate PS on which the surface modifying layer SML is formed may face the carrier substrate CS. The surface modifying layer SML may be in contact with the carrier substrate CS. The contact between the process substrate PS and the carrier substrate CS may be maintained by the fixing part. In an exemplary embodiment of the present inventive concept, Van der waals force or static electricity may act between the surface modifying layer SML and the carrier substrate CS and an attractive force may act between the process substrate PS and the carrier substrate CS. A surface energy difference between the process substrate PS and the carrier substrate CS may be relatively high and the surface modifying layer SML of the process substrate PS may have hydrophobicity. The magnitude of the attractive force need not be particularly strong.

Figure 2C:
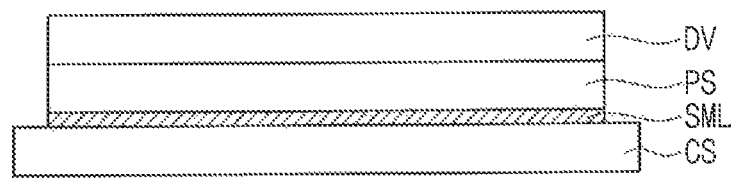

Referring to FIGS. 1 and 2C, a device may be formed on the process substrate PS.

The device may include at least one of various kinds of devices such as, for example, a memory device. The device may include a pixel used in a display device. The device may be selected according to characteristics of a desired device and the device may be formed on the process substrate PS.

During the formation of the device, the process substrate PS may be transferred and/or the process substrate PS may be disposed on the carrier substrate CS.

In exemplary embodiments of the present inventive concept, the device may include a pixel used in a display device. The pixel may include an interconnection part, a thin film transistor connected to the interconnection part, an electrode switched by the thin film transistor, and an image displaying layer controlled by the electrode.

The interconnection part may include a plurality of gate lines and a plurality of data lines crossing the gate lines.

A plurality of thin film transistors may be provided for passive matrix driving or active matrix driving. When the thin film transistor is provided in an active matrix, a plurality of thin film transistors may be provided and each of the thin film transistors may be connected to a corresponding one of the gate lines and/or a corresponding one of the data lines.

A plurality of electrodes may be provided and each of the electrodes may be connected to each of the thin film transistors.

Even though not shown in the drawings, each of the thin film transistors may include a gate electrode, an active layer, a source electrode, and a drain electrode. The gate electrode may diverge from a corresponding one of the gate lines. The active layer may be insulated from the gate electrode. The source electrode and the drain electrode may be spaced apart from each other on the active layer such that the active layer between the source and drain electrodes may be exposed. The source electrode may diverge from a corresponding one of the data lines.

The image displaying layer may include a liquid crystal layer, an electrophoretic layer, an electrowetting layer, or an organic light emitting layer according to an image display method. The image displaying layer may be driven in response to a voltage applied to the electrode or the electrodes. The pixel will be described in more detail below.

Figure 2D:
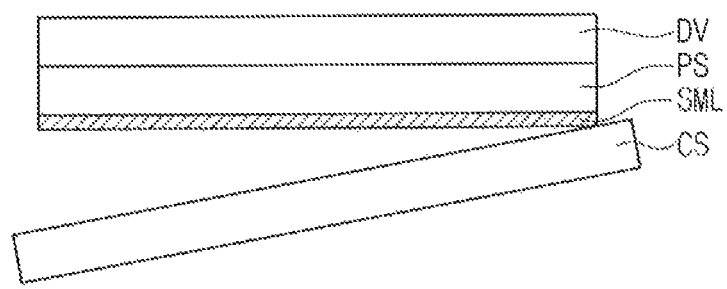

Referring to FIGS. 1 and 2D, the process substrate PS may be separated from the carrier substrate CS.

In exemplary embodiments of the present inventive concept, the method of separating the process substrate PS from the carrier substrate CS is not limited to a specific method. For example, a wedge or an end of a knife may be inserted into an interface between the process substrate PS and the carrier substrate CS and external force may be applied to at least one of the two substrates PS and CS in a perpendicular direction to outer surfaces of the two substrates PS and CS. Thus, the two substrates PS and CS may be separated from each other.

A separation member may be adhered to the outer surface of each of the process and carrier substrates PS and CS and external force may be applied to the separation members in an outward direction perpendicular to the outer surfaces of the two substrates PS and CS, thereby separating the two substrates PS and CS from each other.

When the process substrate PS according to exemplary embodiments of the present inventive concept has the surface modifying layer SML in the separating step of the process and carrier substrates PS and CS, the adhesive force between the process substrate PS and the carrier substrate CS may be weakened. Thus, the process substrate PS may be separated from the carrier substrate CS by a relatively small force, and damage to the process substrate PS may be reduced when the process substrate PS is separated from the carrier substrate CS.

Figure 3:
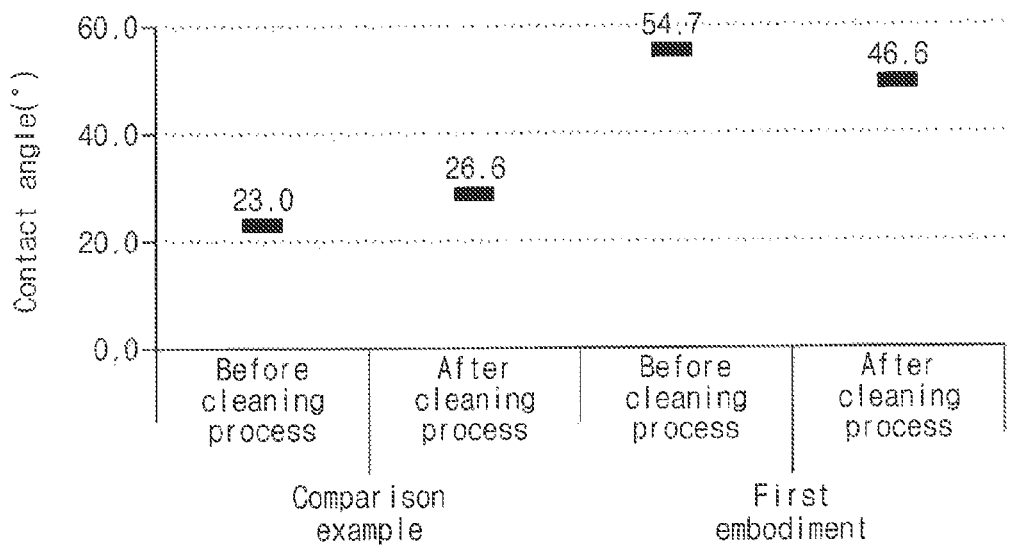
FIG. 3 is a graph showing contact angles of process substrates according to an existence of a surface modifying layer in a method of manufacturing a device substrate according to exemplary embodiments of the present inventive concept.

FIG. 3 is a graph showing contact angles of process substrates according to existence of a surface modifying layer in a method of manufacturing a device substrate according to exemplary embodiments of the present inventive concept and contact angles according to a conventional method of manufacturing a device substrate. In FIG. 3, a contact angle of a comparison example corresponds to a contact angle of a device substrate manufactured by the conventional method. The contact angle of the comparison example is defined as an angle between a surface of a process substrate not having the surface modifying layer and a surface of a drop of water dropped on the process substrate.

In FIG. 3, a contact angle of a first embodiment corresponds to a contact angle of the device substrate manufactured by the method according to an exemplary embodiment of the present inventive concept. The contact angle of the first embodiment is defined as an angle between the surface of the process substrate having the surface modifying layer of the silane compound layer and a surface of a drop of water dropped on the process substrate. The process substrates and the carrier substrates of the comparison example and the first embodiment were formed of glass. Other conditions of the comparison example and the first embodiment were the same as each other except for the surface modifying layer. The contact angles of each of the comparison example and the first embodiment were measured before a cleaning process and after the cleaning process.

Referring to FIG. 3, the contact angles of the first embodiment having the surface modifying layer are greater than the contact angles of the comparison example not having the surface modifying layer regardless of the cleaning process. The hydrophobicity of the process substrate having the surface modifying layer is greater than that of the process substrate not having the surface modifying layer. An adhesive strength between the carrier and the process substrates may be weakened as the hydrophobicity increases. The process substrate having the surface modifying layer according to exemplary embodiments of the present inventive concept may be separated from the carrier substrate with less force than the process substrate not having the surface modifying layer.

Figure 4:
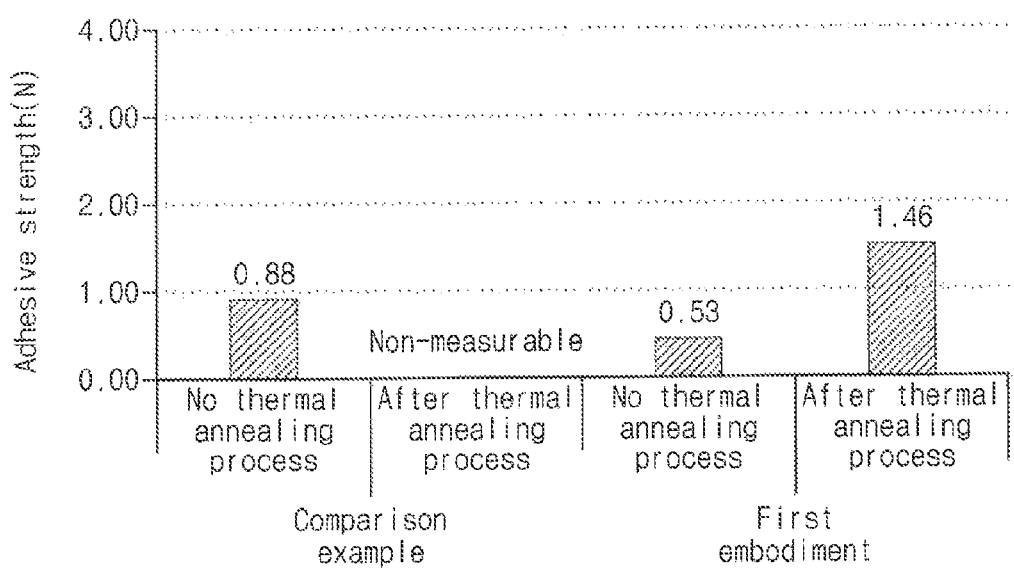
FIG. 4 is a graph showing adhesive strengths between process substrates and carrier substrates when thermal annealing processes are performed in a method of manufacturing a device substrate according to exemplary embodiments of the present inventive concept.

FIG. 4 is a graph showing adhesive strengths between process substrates and carrier substrates when thermal annealing processes are performed in a method of manufacturing a device substrate according to exemplary embodiments of the present inventive concept and adhesive strengths according to an alternative method of manufacturing a device substrate. A comparison example and a first embodiment in FIG. 4 are the same as the comparison example and the first embodiment described with reference to FIG. 3, respectively. The thermal annealing processes may be performed at a temperature of 200 degrees Celsius or more.

Figure 5:
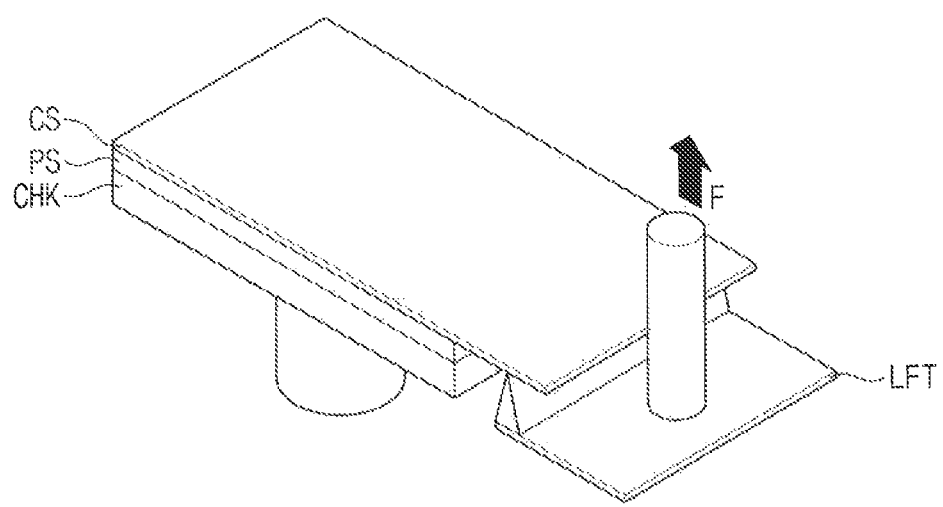
FIG. 5 is a schematic diagram showing an adhesive strength measurement apparatus.

The adhesive strengths may be measured using an adhesive strength measurement apparatus shown in FIG. 5. Referring to FIG. 5, a target substrate, i.e., a process substrate PS placed on a carrier substrate CS may be prepared. The process substrate PS placed on the carrier substrate CS may be loaded onto a chuck CHK and external force may be then applied to the carrier substrate CS by a lifter LFT in a perpendicular direction to a top surface of the carrier substrate CS, i.e., an upward direction. The external force may be applied to the carrier substrate CS until the carrier substrate CS is separated from the process substrate PS. In this case, the external force may be expressed as the adhesive strength. In FIG. 5, the process substrate PS may be in contact with the carrier substrate CS and a top surface of the chuck CH. However, the present inventive concept is not limited thereto. In exemplary embodiments of the present inventive concept, the process substrate PS may contact the carrier substrate CS and the carrier substrate CS may contact the top surface of the chuck CHK. A direction of the external force applied by the lifer LFT may be changed.

Referring to FIG. 4, the adhesive strength of the device substrate manufactured by the alternative method without the surface modifying layer may be 0.88N when the thermal annealing process is not performed. However, the device substrate without the surface modifying layer may have a great adhesive strength beyond the region of the graph illustrated in FIG. 4. When the external force is applied to the carrier substrate in order separate the process substrate from the carrier substrate, the process substrate is not separated from the carrier substrate but the process substrate and the carrier substrate may be broken together. At least portion of the process substrate may be chemically combined with the carrier substrate by the thermal annealing process when the surface modifying layer is not formed on the process substrate by the conventional method.

Referring again to FIG. 4, the adhesive strength of the device substrate having the surface modifying layer manufactured by the conventional method may be 0.53N when the thermal annealing process is not performed. The adhesive strength of the device substrate having the surface modifying layer may be 1.46N after the thermal annealing process is performed. The adhesive strength of the device substrate having the surface modifying layer after the thermal annealing process may be stronger than that of the device substrate having the surface modifying layer before the thermal annealing process. However, even though the thermal annealing process may be performed on the device substrate having the surface modifying layer, the device substrate having the surface modifying layer may still have a relatively low adhesive strength when the thermal annealing process is not performed. The process substrate having the surface modifying layer may be separated from the carrier substrate.

Figure 6:
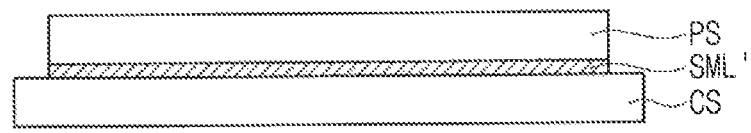
FIG. 6 is a cross-sectional view showing a method of manufacturing a device substrate including a surface modifying layer according to an exemplary embodiment of the present inventive concept.

FIG. 6 is a cross-sectional view showing a method of manufacturing a device substrate including a surface modifying layer according to an exemplary embodiment of the present inventive concept. FIG. 6 corresponds to FIG. 2B. Hereinafter, differences between the present exemplary embodiment and the exemplary embodiments described above (e.g., in FIG. 2B) will be described. Omitted descriptions may be the same as those described above with regard to FIG. 2B. A surface modifying layer SML' of an exemplary embodiment may include a different material from that of the surface modifying layer SML of the exemplary embodiments described above.

Referring to FIG. 6, the surface modifying layer SML' may include a material having different surface energy from that of the process substrate PS. The surface modifying layer SML' according to an exemplary embodiment of the present inventive concept may include a metal oxide layer including a metal oxide. The metal oxide may have hydrophobicity greater than that of the process substrate PS. The metal oxide layer may include indium-zinc oxide (IZO), indium-tin oxide (ITO), indium-tin-zinc oxide (ITZO), and/or germanium-zinc oxide (GZO).

The metal oxide layer may be deposited on the process substrate PS. However, the present inventive concept is not limited thereto. In exemplary embodiments of the present inventive concept, a fluid including the metal oxide may be coated on the process substrate PS. The coated metal oxide may be heated to remove a solvent of the fluid and the metal oxide layer may be formed thereby.

The process substrate PS may be disposed on a carrier substrate CS. The surface modifying layer SML' of the process substrate PS may face the carrier substrate CS. The surface modifying layer SML' (i.e., the metal oxide layer) may be in contact with the carrier substrate CS. The process substrate PS may be fixed to the carrier substrate CS by a fixing part disposed on the carrier substrate CS. Van der waals force and/or static electricity may act between the metal oxide layer and the carrier substrate CS such that an attractive force may act between the process substrate PS and the carrier substrate CS. A surface energy difference between the process substrate PS and the carrier substrate CS may be relatively high and the surface modifying layer SML of the process substrate PS may have hydrophobicity. The magnitude of the attractive force may be relatively low.

Figure 7:
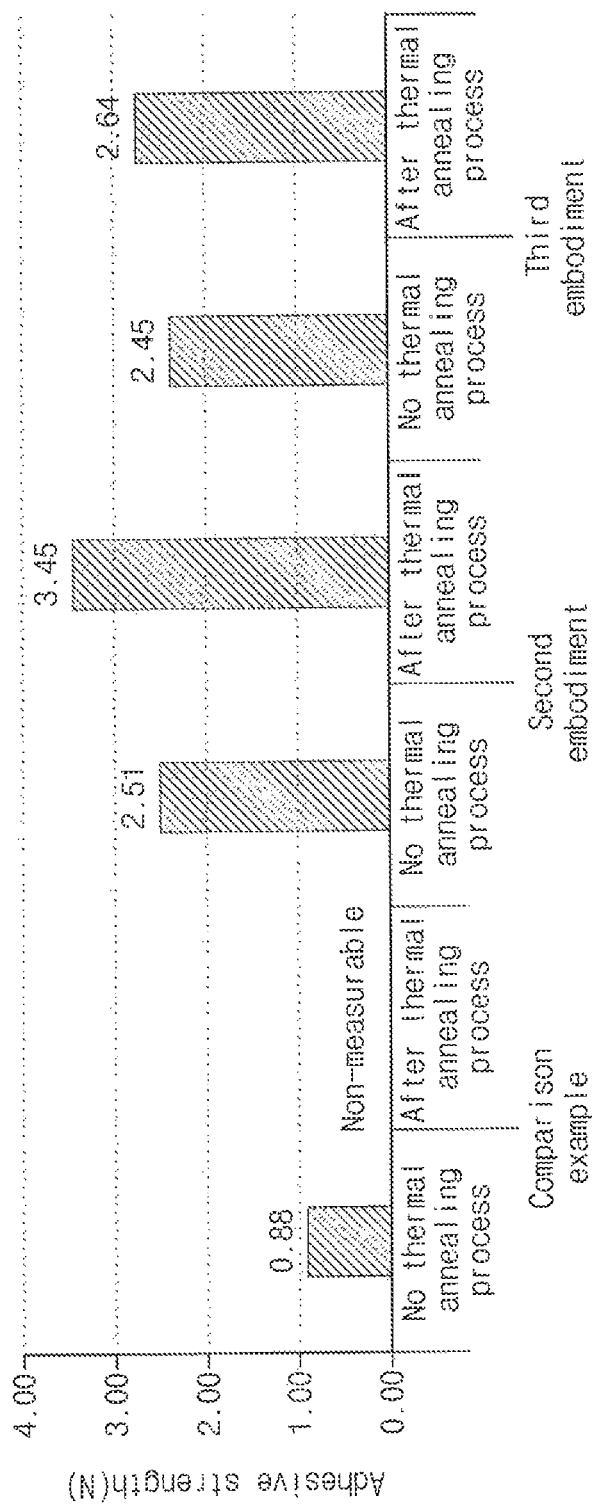
FIG. 7 is a graph showing adhesive strengths between process substrates and carrier substrates when thermal annealing processes are performed in a method of manufacturing a device substrate according to exemplary embodiments of the present inventive concept.

FIG. 7 is a graph showing adhesive strengths between process substrates and carrier substrates when thermal annealing processes are performed in a method of manufacturing a device substrate according to exemplary embodiments of the present inventive concept and adhesive strengths according to a conventional method of manufacturing a device substrate. The adhesive strengths were measured using the adhesive strength measurement apparatus shown in FIG. 5.

In FIG. 7, adhesive strengths of a comparison example show adhesive strengths before and after the thermal annealing process of a device substrate manufactured without the metal oxide layer as the surface modifying layer by the conventional method. Second and third embodiments of FIG. 7 are device substrates having the metal oxide layers as the surface modifying layers according to exemplary embodiments of the present inventive concept. Adhesive strengths of the second and third embodiments of FIG. 7 may be adhesive strengths before and after the thermal annealing process of the device substrates described below. ITO may be used as the metal oxide layer of the second embodiment, and IZO may be used as the metal oxide layer of the third embodiment. The process substrates and the carrier substrates of the alternate example and the approach described above may be formed of glass. Other conditions of the alternate example and the approach described above except the metal oxide layers may be the same as each other.

Referring to FIG. 7, the adhesive strength of the device substrate without the surface modifying layer of the comparison example may be 0.88N when the thermal annealing process is not performed. However, the device substrate without the surface modifying layer of the comparison example after the thermal annealing process may have a higher adhesive strength than shown in the graph illustrated in FIG. 7. When external force is applied to the carrier substrate without the surface modifying layer of the alternate example after the thermal annealing process in order separate the process substrate from the carrier substrate, the process substrate of the alternate example is not separated from the carrier substrate but the process substrate and the carrier substrate may be broken together. Even though the device substrates having the metal oxide layers of the approach described above may have adhesive strengths greater than that of the conventional device substrate when the thermal annealing process is not performed, adhesive strengths of the approach described above may be markedly less than that of the alternate device substrate after the thermal annealing process. An adhesive strength before the thermal annealing process may be 2.51N and an adhesive strength after the thermal annealing process may be 3.45N in the approach described above having the surface modifying layer formed using ITO as the metal oxide. The adhesive strength of the second embodiment after the thermal annealing process may be markedly less than that of the alternate approach. An adhesive strength before the thermal annealing process may be 2.45N and an adhesive strength after the thermal annealing process may be 2.64N in the approach described above having the surface modifying layer formed using IZO as the metal oxide. The adhesive strength after the thermal annealing process of the approach described above may be markedly less than that of the alternate approach and is less than that of the approach described above using ITO as the metal oxide.

A plurality of thermal annealing processes may be performed when the device is formed on the process substrate. The adhesive strength after the thermal annealing process may be a factor in the process of separating the process substrate and the carrier substrate from each other.

According to exemplary embodiments of the present inventive concept, the device substrate may be manufactured using the metal oxide layer as the surface modifying layer. The process substrate may be separated from the carrier substrate.

Figure 8:
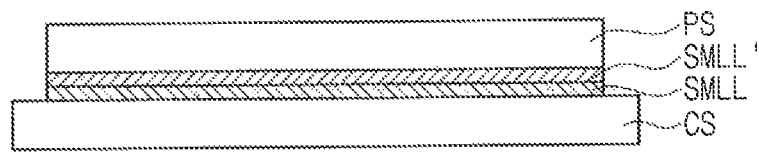
FIG. 8 is a cross-sectional view showing a method of manufacturing a device substrate including a surface modifying layer according to an exemplary embodiment of the present inventive concept.

FIG. 8 is a cross-sectional view showing a method of manufacturing a device substrate including a surface modifying layer according to an exemplary embodiment of the present inventive concept. FIG. 8 corresponds to FIG. 2B in the method of manufacturing the semiconductor device according to an exemplary embodiment of the present inventive concept.

Referring to FIG. 8, a surface modifying layer SML may include two types of materials having surface energies different from those of the process substrate PS. The surface modifying layer SML may be formed on the process substrate PS. In exemplary embodiments of the present inventive concept, the surface modifying layer SML may have a first layer SMLL and a second layer SMLL' that include two types of materials different from each other. The first layer SMLL and the second layer SMLL' may include materials that have surface energies different from that of the process substrate PS and that have hydrophobic properties greater than that of the process substrate PS. In an exemplary embodiment of the present inventive concept, the first layer SMLL may be a silane compound layer including a silane compound and the second layer SMLL' may be a metal oxide layer including a metal oxide.

The silane compound may be included in a self-aligned monolayer form. The silane compound may include polydimethylsiloxane (PDMS). The metal oxide layer may include indium-zinc oxide (IZO), indium-tin oxide (ITO), indium-tin-zinc oxide (ITZO), and/or germanium-zinc oxide (GZO).

The formation order of the first and second layers SMLL and SMLL' is not limited to the approach shown. In exemplary embodiments of the present inventive concept, the metal oxide layer and the silane compound layers may be sequentially stacked on the process substrate PS.

The process substrate PS may be disposed on a carrier substrate CS. A surface of the process substrate PS, on which the first and second layers SMLL and SMLL' are formed, may face the carrier substrate CS. The first layer SML (e.g., the silane compound layer) of the first and second layers SMLL and SMLL' may be in contact with the carrier substrate CS. The process substrate PS may be fixed to the carrier substrate CS by a fixing part disposed on the carrier substrate CS.

Figure 9:
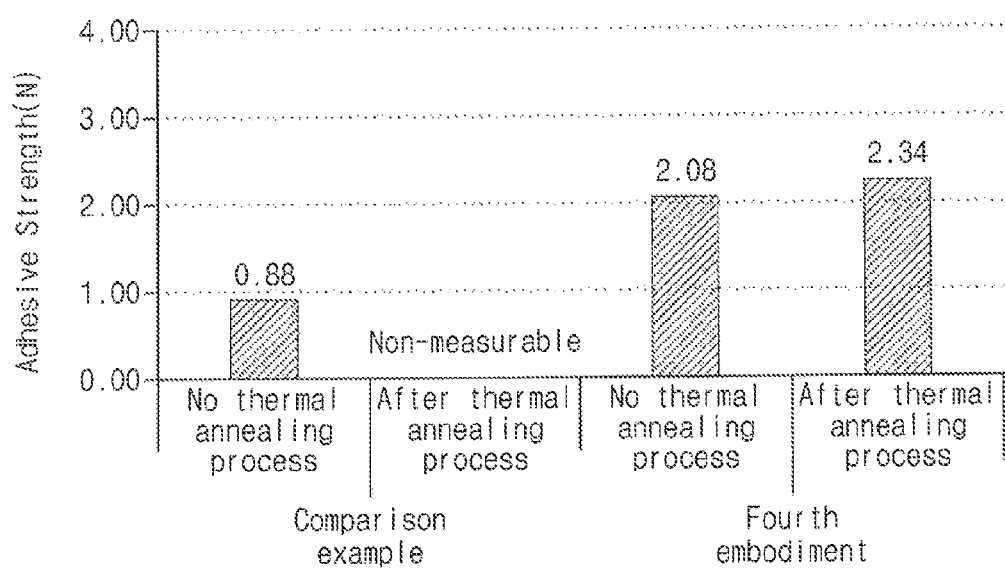
FIG. 9 is a graph showing adhesive strengths between process substrates and carrier substrates when thermal annealing processes are performed in a method of manufacturing a device substrate according to exemplary embodiments of the present inventive concept.

FIG. 9 is a graph showing adhesive strengths between process substrates and carrier substrates when thermal annealing processes are performed in a method of manufacturing a device substrate according to an exemplary embodiment of the present inventive concept and adhesive strengths according to an alternate method of manufacturing a device substrate. The adhesive strengths were measured using the adhesive strength measurement apparatus shown in FIG. 5.

Adhesive strengths of an alternate example of FIG. 9 show adhesive strengths before and after the thermal annealing process of a device substrate manufactured without the metal oxide layer by the alternate method.

FIG. 9 illustrates the device substrate having the metal oxide layer and the silane compound layer that are sequentially formed on the process substrate according to an exemplary embodiment of the present inventive concept. Adhesive strengths before and after the thermal annealing process are shown. Here, IZO may be used as the metal oxide and polydimethylsiloxane (PDMS) may be used as the silane compound.

The process substrates and the carrier substrates of the alternate example and the instant approach may be formed of glass. Other conditions of the alternate example and the instant approach except the metal oxide layer and the silane compound layer may be the same as each other.

Referring to FIG. 9, the adhesive strength of the device substrate without the surface modifying layer of the comparison example may be 0.88N when the thermal annealing process is not performed. The device substrate without the surface modifying layer of the comparison example after the thermal annealing process may have a higher adhesive strength than shown in the graph illustrated in FIG. 9. When external force is applied to the carrier substrate without the surface modifying layer of the alternate example after the thermal annealing process in order separate the process substrate from the carrier substrate, the process substrate of the comparison example is not separated from the carrier substrate but the process substrate and the carrier substrate may be broken together. Even though the device substrate having the metal oxide layer and the silane compound layer of the instant approach may have an adhesive strength greater than that of the alternate device substrate when the thermal annealing process is not performed, an adhesive strength of the fourth embodiment may be markedly less than that of the alternate device substrate after the thermal annealing process. The adhesive strength before the thermal annealing process of the instant approach may be 2.08N, and the adhesive strength after the thermal annealing process of the fourth embodiment may be 2.34N. The adhesive strength after the thermal annealing process of the instant approach may be markedly less than that of the alternate approach in which the process substrate is not separated from the carrier substrate. The instant approach may have an adhesive strength less than those of the approach discussed above having only the metal oxide layers before and after thermal annealing process. The adhesive strengths before the thermal annealing process of the approach discussed above may be 2.51N and 2.45N, respectively, but the adhesive strength before the annealing process of the instant approach may be 2.08N. The adhesive strengths after the thermal annealing process of the approach discussed above may be 3.45N and 2.64N, respectively, but the adhesive strength after the annealing process of the instant approach may be 2.34N.

In the device substrate manufactured using the metal oxide layer and the silane compound layer as the surface modifying layer SML in exemplary embodiments of the present inventive concept the process substrate PS may be separated from the carrier substrate CS.

A flexible substrate may be bent such that it may be difficult to perform a process on the flexible substrate using a conventional apparatus. For example, if the flexible substrate is disposed on robot arms in order to be transferred, the flexible substrate may be bent and fall between the robot arms. According to exemplary embodiments of the present inventive concept, the manufacturing processes of the device may be performed on the flexible substrate disposed on the carrier substrate CS formed of a hard material. The device may be stably manufactured on the flexible process substrate. The process substrate PS and the carrier substrate CS may be separated from each other.

When the surface modifying layer SML is formed on a target substrate, contamination of the carrier substrate CS may be minimized and the carrier substrate CS may be repeatedly used without an additional cleaning process.

In exemplary embodiments of the present inventive concept, the surface modifying layer SML may be formed on an entire surface of the process substrate PS. However, the inventive concept is not limited thereto. In exemplary embodiments of the present inventive concept, the surface modifying layer SML may be formed on a portion of the process substrate PS. To form the surface modifying layer SML on a portion of the process substrate PS, the surface modifying layer SML may be formed on the entire surface of the process substrate PS and a portion of the surface modifying layer SML may be removed. The surface modifying layer SML may be removed by an etching process or a grinding process.

Figure 10A:
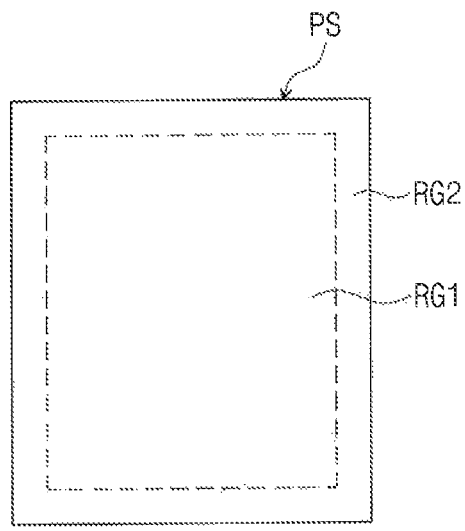
FIGS. 10A to 10C are plan views showing examples of a location of a surface modifying layer formed on a portion of a process substrate according to exemplary embodiments of the present inventive concept.
Figure 10B:
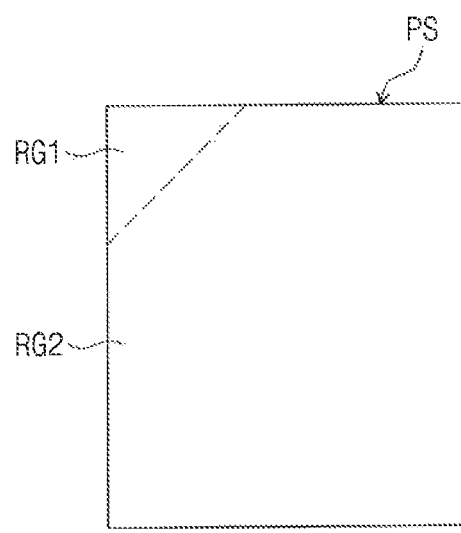
Figure 10C:
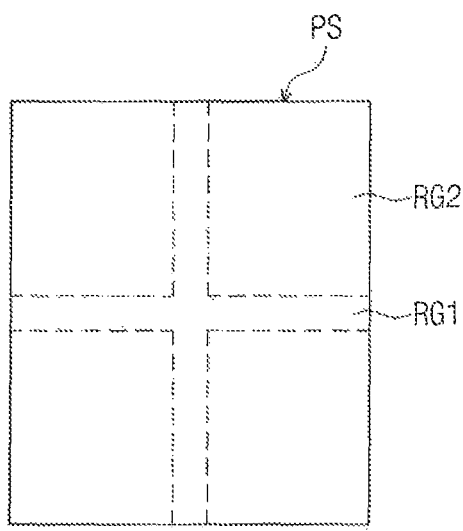

FIGS. 10A to 10C are plan views showing examples of a location of a surface modifying layer formed on a portion of a process substrate according exemplary embodiments of the present inventive concept. In FIGS. 10A to 10C, a first region RG1 corresponds to a region on which the surface modifying layer is formed, and a second region RG2 corresponds to a region on which the surface modifying layer is not formed.

Referring to FIG. 10A, in exemplary embodiments of the present inventive concept, a process substrate PS may have a rectangular shape including a pair of long sides and a pair of short sides. The first region RG1 may be disposed in an inner part of the process substrate PS and the second region RG2 may be configured to surround the first region RG1 when viewed from a plan view. The second region RG2 may be disposed along an edge of the process substrate PS and the first region RG1 may be disposed in a region of the process substrate PS except for where the second region RG2 is disposed. The second region RG2 may surround the first region RG1. However, the inventive concept is not limited thereto. In exemplary embodiments of the present inventive concept, the second region RG2 may be configured to correspond to one, two or three long and short sides of the process substrate PS.

The first region RG1 may be wider than the second region RG2. However, the inventive concept is not limited thereto.

When portions of the process substrate PS and carrier substrate CS which correspond to the first region RG1 include the surface modifying layer, their adhesive strength may be decreased, as described above, such that the process substrate PS may be in contact with the carrier substrate CS but the adhesive strength therebetween is relatively low. When the processes of forming the device on the process substrate PS are performed, a portion of the process substrate PS which corresponds to the second region RG2 may be combined with the carrier substrate CS. The process substrate PS may be supported on the carrier substrate CS. The process substrate PS may be supported by the carrier substrate CS such that the processes of forming the device may be performed. The process substrate PS corresponding to the second region RG2 may be removed by a cutting process after the processes of the forming the device are completed, and the process substrate PS may be separated from the carrier substrate CS.

When the adhesive strength between the second region RG2 of process substrate PS and the carrier substrate CS is relatively low according to the formation processes of the device, the second region RG2 of the process substrate PS need not be removed. For example, if the processes of forming the device include thermal treatment processes at temperatures of less than about 200 degrees Celsius, the second region RG2 of the process substrate PS need not be removed. If the process substrate PS is a display substrate, the display substrate may include a displaying region including a plurality of pixels, and a non-displaying region corresponding to at least one side of the displaying region. An image might not be shown in the non-display region. For example, the displaying region may correspond to the first region RG1, and the non-displaying region may correspond to the second region RG2. The adhesive strength between the process substrate PS and the carrier substrate CS in the first region RG1 may be smaller than the adhesive strength between the process substrate PS and the carrier substrate CS in the second region RG2. The two substrates may be separated from each other in the first region RG1 with less force than in the second region RG2 such that pixel defects may be reduced.

The first and second regions RG1 and RG2 are not limited to the displaying region and the non-displaying region. In exemplary embodiments of the present inventive concept, the first and second regions RG1 and RG2 may be applied to other regions in order to separate two substrates from each other.

Referring to FIG. 10B, the first region RG1 may be disposed in a region corresponding to a corner of the process substrate PS. The second region R2 may be disposed in a region corresponding to the rest of the process substrate PS.

In an exemplary embodiment of the present inventive concept, when the first region RG1 is disposed in the region corresponding to the corner of the process substrate PS, the corner of the process substrate PS may be separated from the rest of the process substrate PS. For example, a wedge or an end of a knife may be inserted into an interface between the process substrate PS and the carrier substrate CS to form a predetermined space between the process substrate PS and the carrier substrate CS, and at least one of the process substrate PS and the carrier substrate CS may be pulled or pushed to separate the process substrate PS and the carrier substrate CS from each other. For example, the wedge or the end of the knife may be inserted into an interface between the corner of the process substrate PS and the carrier substrate CS to separate the two substrates. Only a small space may be required between the two substrates in order to separate the two substrates from each other, and a wide first region RG1 might not be needed. An area of the first region RG1 may be smaller than that of the second region RG2.

Referring to FIG. 10C, the first region RG1 may be disposed in a cross-shape. The second region RG2 may be disposed on the rest of the process substrate PS. The cross-shape of the first region RG1 may have a center coinciding with a center of the process substrate PS and each branch of the cross-shape may be parallel to at least one side of the process substrate PS.

In an exemplary embodiment of the present inventive concept, the first region RG1 may have an area that is smaller than that of the second region RG2. The process substrate PS and the carrier substrate CS may be in contact with each other by a relative high adhesive strength in a region corresponding to the second region RG2. When the second region RG2 is divided into sub-regions by the first region RG1, an entire adhesive strength between the process substrate PS and the carrier substrate CS may be weakened. The process substrate PS and the carrier substrate may be separated from each other.

The methods of manufacturing the device substrate according to exemplary embodiments of the present inventive concept may be used in order to form a device on a thin substrate. However the methods are not limited to a specific use. For example, a display device may be formed using the method of manufacturing the device substrate A display device manufactured by a manufacturing method according to an exemplary embodiment of the present inventive concept will be described and then the method of manufacturing the display device will be described.

Figure 11:
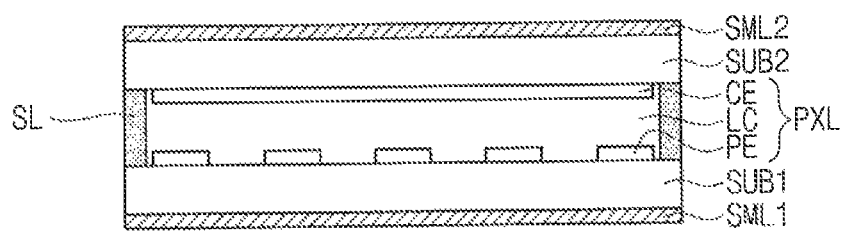
FIG. 11 is a cross-sectional view showing a display device according to an exemplary embodiment of the present inventive concept.

FIG. 11 is a cross-sectional view showing a display device according to an exemplary embodiment of the present inventive concept.

Referring to FIG. 11, the display device may include a first substrate SUB1, a second substrate SUB2 opposite to the first substrate SUB1, and a pixel PXL disposed between the first and second substrates SUB1 and SUB2.

The first substrate SUB1 may have two surfaces (e.g., a first surface and a second surface) opposite each other. The first surface of the first substrate SUB1 may face the second substrate SUB2.

The pixel PXL may be disposed on the first substrate SUB1. The pixel PXL may include at least one electrode and an image displaying layer driven by the electrode. In exemplary embodiments of the present inventive concept, if the display device is a liquid crystal display device, the electrode may include at least two electrodes (e.g., a first electrode and a second electrode) spaced apart from each other, and the image displaying layer may be a liquid crystal layer LC. In an exemplary embodiment of the present inventive concept, the first electrode and the second electrode may generate an electric field and may be defined as a pixel electrode PE and a common electrode CE. In an exemplary embodiment of the present inventive concept, the first electrode and the second electrode may be the pixel electrode PE and the common electrode CE, respectively. The image displaying layer may be a liquid crystal layer LC.

The second substrate SUB2 may have two surfaces (e.g., a third surface and a fourth surface) opposite to each other. The third surface of the second substrate SUB2 may face the first surface of the first substrate SUB1.

The second substrate SUB2 may include a same material as or a different material from the first substrate SUB1. In exemplary embodiments of the present inventive concept, the first and second substrates SUB1 and SUB2 may include glass. However, the inventive concept is not limited thereto. In exemplary embodiments of the present inventive concept, the first substrate SUB1 may include glass and the second substrate SUB2 may include plastic.

A sealing part SL may be disposed between the first substrate SUB1 and the second substrate SUB2. The sealing part SL may be disposed along edges of the first and second substrates SUB1 and SUB2 when viewed from a plan view. The sealing part SL may seal the liquid crystal layer LC.

In exemplary embodiments of the present inventive concept, the second substrate SUB2 is shown along with the first substrate SUB1. In exemplary embodiments of the present inventive concept, the second substrate SUB2 may be omitted. For example, the pixel PXL may be disposed on the first substrate SUB1 and an encapsulation layer may be disposed on the pixel PXL.

The pixel PXL may include an interconnection part and a thin film transistor. The interconnection part may include a gate line and a data line, and the thin film transistor may be connected to the gate line or the date line. The thin film transistor may be connected to the pixel electrode PE of the pixel PXL.

First and second surface modifying layers SML1 and SML2 may be disposed on the second surface of the first substrate SUB1 and the fourth surface of the second substrate SUB2.

In the display device, when a gate signal is applied to the gate line, the thin film transistor may be turned-on. A data signal applied to the data line may be applied to the pixel electrode PE through the thin film transistor. When the thin film transistor is turned-on to apply the data signal to the pixel electrode PE, the electric field may be generated between the pixel electrode PE and the common electrode CE. Liquid crystal molecules of the liquid crystal layer LC may be driven by the electric field generated by a difference between voltages applied to the common electrode CE and the pixel electrode PE. The intensity of light transmitted through the liquid crystal layer LC may be changed to display an image.

FIGS. 12A to 12E are cross-sectional views showing a method of manufacturing the display device illustrated in FIG. 11. Hereinafter, the method of manufacturing a display device according to exemplary embodiments of the present inventive concept will be described in detail with reference to FIGS. 12A to 12E. In order to avoid redundancy of explanation, the present embodiment will be described while focusing on the differences between the method of manufacturing the display device and the manufacturing method of the device substrate discussed above. The descriptions discussed above may be omitted or mentioned briefly.

Referring to FIG. 12A, a first surface modifying layer SMLL1 may be formed on a first substrate SUB1. A second surface modifying layer SMLL2 may be formed on a second substrate SUB2. The second surface modifying layer SMLL2 may be formed independently of the first surface modifying layer SMLL1.

Each of the first and second surface modifying layers SMLL1 and SMLL2 may include a single-layer of a silane compound layer or a metal oxide layer, or a double layer of a silane compound layer and a metal oxide layer. The first surface modifying layer SMLL1 may include the same material as the second surface modifying layer SMLL2. The first surface modifying layer SMLL1 may include a different material from the second surface modifying layer SMLL2. For example, in exemplary embodiments of the present inventive concept, the first and second surface modifying layers SMLL1 and SMLL2 may include the silane compound. In exemplary embodiments of the present inventive concept, the first surface modifying layer SMLL1 may include the silane compound and the second surface modifying layer SMLL2 may include the metal oxide.

Referring to FIG. 12B, the first substrate SUB1 having the first surface modifying layer SMLL1 may be disposed on a first carrier substrate CS1. The second substrate SUB2 having the second surface modifying layer SMLL2 may be disposed on a second carrier substrate CS2. The first surface modifying layer SMLL1 of the first substrate SUB1 may contact the first carrier substrate CS1 and the second surface modifying layer SMLL2 of the second substrate SUB2 may contact the second carrier substrates CS2.

Figure 12C:
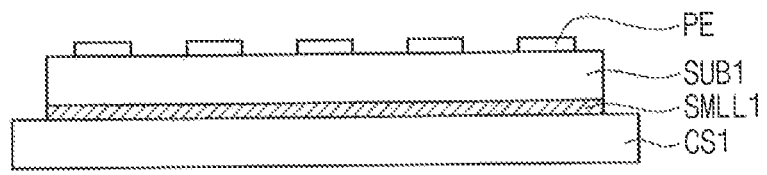

Referring to FIG. 12C, a pixel electrode PE may be formed on the first substrate SUB1 disposed on the first carrier substrate CS1. A common electrode CE may be formed on the second substrate SUB2 disposed on the second carrier substrate CS2.

Transparent conductive materials may be respectively deposited on the first and second substrates SUB1 and SUB2 and the deposited transparent conductive materials may be patterned using photolithography processes to form the pixel electrode PE and the common electrode CE. A gate line, a data line and a thin film transistor between the pixel electrode PE and the first substrate SUB1 may be formed by patterning processes using photolithography processes. However, the methods of forming the pixel electrode PE and the common electrode CE are not limited to the above descriptions. In exemplary embodiments of the present inventive concept, the pixel electrode PE and the common electrode CE may be formed by at least one of various known methods.

The processes of forming the pixel and common electrodes PE and CE, the gate and data lines and the thin film transistor may be performed when the first and second substrates SUB1 and SUB2 are disposed on the first and second carrier substrates CS1 and CS2. When the first and second substrates SUB1 and SUB2 are thin or have flexibility, the first and second carrier substrates CS1 and CS2 may maintain the flatness of the first and second substrates SUB1 and SUB and may reduce vibration.

Figure 12D:
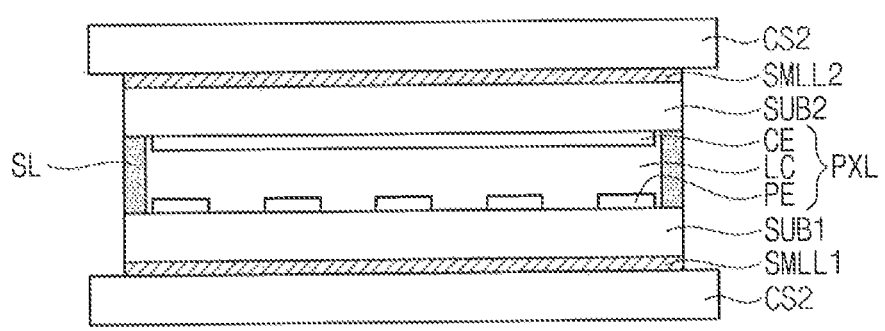

Referring to FIG. 12D, a liquid crystal layer LC may be interposed between the first and second substrates SUB1 and SUB2 to complete a display device. The liquid crystal layer LC may be formed by a one-drop-filling (ODF) process. A sealing part may be provided around the first and second substrates SUB1 and SUB2 such that the liquid crystal layer LC is sealed by the sealing part. The sealing part may be provided on an edge of one of the first and second substrates SUB1 and SUB2 before the liquid crystal layer LC is interposed between the two substrates SUB1 and SUB2. After the liquid crystal layer LC is interposed between the first and second substrates SUB1 and SUB2, the sealing part may be hardened to seal the liquid crystal layer LC.

Figure 12E:
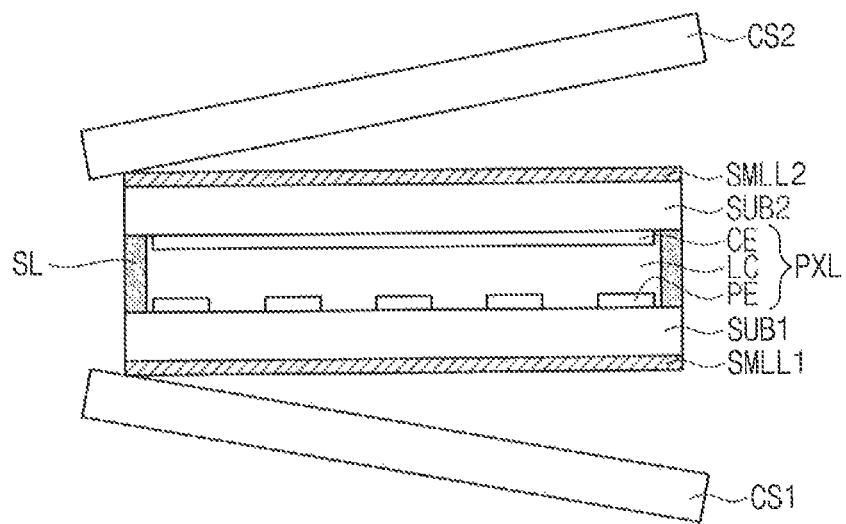

Referring to FIG. 12E, the first carrier substrate CS1 and the second carrier substrate CS2 may be removed from the display device. The first carrier substrate CS1 may be separated from the first substrate SUB1 and the second carrier substrate CS2 may be separated from the second substrate SUB2. Methods of separating the first and second substrates SUB1 and SUB2 from the first and second carrier substrates CS1 and CS2 may be performed using the methods described above.

In exemplary embodiments of the present inventive concept, the separation process of the first substrate SUB1 and the first carrier substrate CS1 and the separation process of the second substrate SUB2 and the second carrier substrate CS2 may be performed by using the first surface modifying layer SML1 and the second surface modifying layer SML2. The first and second surface modifying layers SML1 and SML2 may allow the surface of the display device to have a hydrophobicity to weaken the adhesive strengths between the substrates SUB1 and SUB2 and the carrier substrates CS1 and CS2.

Figure 13:
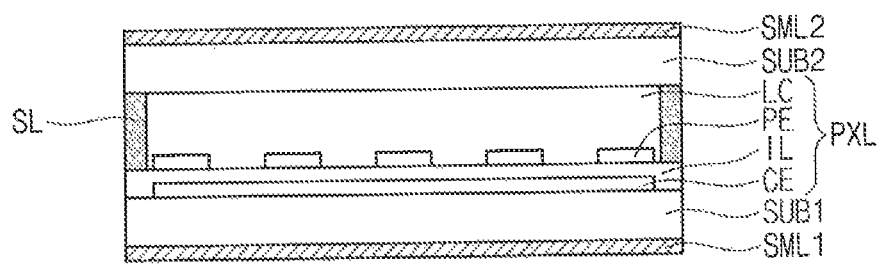
FIG. 13 is a cross-sectional view showing a display device according to an exemplary embodiment of the present inventive concept.

In the methods of manufacturing the device substrate according to exemplary embodiments of the present inventive concept, the surface modifying layer SML may have another function as well as the function of the surface modifying layer SML, for example, when the surface modifying layer is applied to a display device having a predetermined structure. FIG. 13 is a cross-sectional view showing a display device according to an exemplary embodiment of the present inventive concept. A second surface modifying layer SML2 of FIG. 13 may be used as the surface modifying layer. The second surface modifying layer SML2 of FIG. 13 may be used as an antistatic layer. FIGS. 14A to 14E are cross-sectional views showing a method of manufacturing the display device illustrated in FIG. 13.

Referring to FIG. 13, the display device may include a first substrate SUB, a common electrode CE provided on the first substrate SUB1, a pixel electrode PE insulated from the common electrode CE, a second substrate SUB2, and a liquid crystal layer LC disposed between the first and second substrates SUB1 and SUB2. Both the common electrode CE and the pixel electrode PE may be disposed on the first substrate SUB1. An insulating layer IL may be disposed between the common electrode CE and the pixel electrode PE. The common electrode CE may be disposed on the first substrate SUB1 and the insulating layer IL may be disposed on the common electrode CE. The pixel electrode PE may be disposed on the insulating layer IL. However, locations of the common electrode CE and the pixel electrode PE are not limited to these locations. The locations of the common and pixel electrodes CE and PE may be any desired location. For example, the pixel electrode PE may be disposed on the first substrate SUB1, the insulating layer IL may be disposed on the pixel electrode PE, and the common electrode CE may be disposed on the insulating layer IL. The pixel electrode PE and the common electrode CE may be disposed on the same layer at a same level.

The pixel electrode PE may overlap the common electrode CE when viewed from a plan view in FIG. 13. However, the inventive concept is not limited thereto. The pixel electrode PE and the common electrode CE may be alternately and repeatedly arranged in a direction parallel to a top surface of the first substrate SUB1.

A sealing part may be disposed between the first and second substrates SUB1 and SUB2. The sealing part may be disposed along edges of the first and second substrates SUB1 and SUB2 when viewed from a plan view. The sealing part may seal the liquid crystal layer LC. Even though not shown in FIG. 13, an interconnection part and a thin film transistor may be disposed between the first substrate SUB1 and the pixel electrode PE. The interconnection part may include a gate line and a data line and the thin film transistor may be connected to the gate line or the data line. The pixel electrode PE may be connected to the thin film transistor.

First and second surface modifying layers SML1 and SML2 may be provided on outer surfaces of the first and second substrates SUB1 and SUB2, respectively. The second surface modifying layer SML2 may include a metal oxide layer. The metal oxide layer may have conductivity according to a doping amount of a metal. The metal oxide layer may be grounded to discharge static electricity provided to the outer surface of the second substrate SUB2 to the outside of the display device.

In the display device described above, the second substrate SUB2 might not have an electrode formed of a conductive material. If the static electricity is accumulated in the second substrate SUB2, an electric discharge of the static electricity may occur. As described above, the second surface modifying layer SML2 may include a material having conductivity and may prevent the electric discharge of the accumulated static electricity.

FIGS. 14A to 14E are cross-sectional views showing a method of manufacturing the display device illustrated in FIG. 13. Hereinafter, the present embodiment will be described while focusing on the differences from the aforementioned embodiment of FIGS. 12A to 12E in order to avoid redundancy of explanation.

Referring to FIG. 14A, a first surface modifying layer SMLL1 may be formed on a first substrate SUB1. A second surface modifying layer SMLL2 may be formed on a second substrate SUB2. The second substrate SUB2 may be formed independently from the first surface modifying layer SMLL1. The first surface modifying layer SMLL1 may include a single-layer of a silane compound layer or a metal oxide layer, or a double layer of a silane compound layer and a metal oxide layer. The second surface modifying layer SMLL2 may include a single-layer of a metal oxide layer, or a double layer of a silane compound layer and a metal oxide layer. The metal oxide layer may be doped with a sufficient amount of a metal to have conductivity.

Referring to FIG. 14B, the first substrate SUB1 having the first surface modifying layer SMLL1 may be disposed on a first carrier substrate CS1. The second substrate SUB2 having the second surface modifying layer SMLL2 may be disposed on a second carrier substrate CS2.

Referring to FIG. 14C, a common electrode CE, an insulating layer IL, and a pixel electrode PE may be formed on the first substrate SUB1 disposed on the first carrier substrate CS1. Each of the common electrode CE, the insulating layer IL and the pixel electrode PE may be formed using a photolithography process.

A gate line, a data line and a thin film transistor between the pixel electrode PE and the first substrate SUB1 may be formed by a plurality of patterning processes using a plurality of photolithography processes. However, the methods of forming the pixel electrode PE and the common electrode CE are not limited to the above descriptions. In exemplary embodiments of the present inventive concept, the pixel electrode PE and the common electrode CE may be formed by at least one of various known methods.

Referring to FIG. 14D, a liquid crystal layer LC may be interposed between the first and second substrates SUB1 and SUB2 to complete a display device.

Figure 14E:
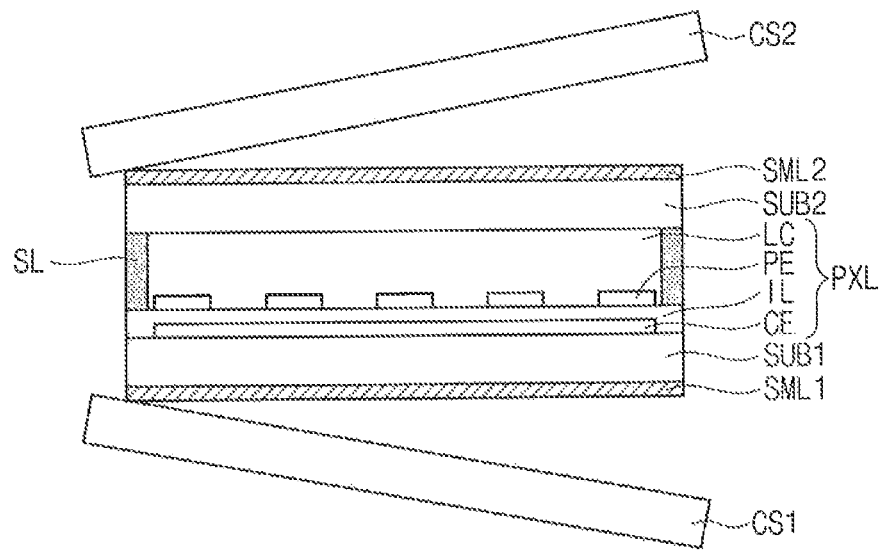

Referring to FIG. 14E, the first carrier substrate CS1 and the second carrier substrate CS2 may be removed from the display device. The first carrier substrate CS1 may be separated from the first substrate SUB1 and the second carrier substrate CS2 may be separated from the second substrate SUB2. Each of methods of separating the first and second substrates SUB1 and SUB2 from the first and second carrier substrates CS1 and CS2 may be performed using the methods described above.

In an exemplary embodiment of the present inventive concept, the separation process of the first substrate SUB1 and the first carrier substrate CS1 and the separation process of the second substrate SUB2 and the second carrier substrate CS2 may be performed by using the first surface modifying layer SMLL1 and the second surface modifying layer SMLL2. The second surface modifying layer SMLL2 may be formed of a conductive material and may be grounded such that it may prevent damage to the display device by the electric discharge of accumulated static electricity.

Exemplary embodiments of the present inventive concept provide methods of separating the process substrate from the carrier substrate and methods of manufacturing the flexible device substrate using the same. Exemplary embodiments of the present inventive concept provide display devices manufactured using the methods.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A method of manufacturing a device substrate, the method comprising:
   forming a surface modifying layer on a process substrate, wherein the surface modifying layer has a hydrophobicity different from a hydrophobicity of the process substrate;
   disposing the process substrate on a carrier substrate, wherein the surface modifying layer is disposed between the process substrate and the carrier substrate;
   forming a device on the process substrate; and
   separating the process substrate from the carrier substrate,
   wherein the surface modifying layer comprises a first layer which includes a first material and a second layer which is disposed between the first layer and the process substrate, and the second layer includes a second material different from the first material.

2. The method of claim 1, wherein the hydrophobicity of the first and second materials is greater than the hydrophobicity of the process substrate.

3. The method of claim 2, wherein the surface modifying layer comprises a silane compound.

4. The method of claim 3, wherein the silane compound includes hexamethyldisiloxane (HMDS).

5. The method of claim 3, wherein forming the surface modifying layer comprises:
   forming a silane compound layer comprising a self-assembled monolayer on the process substrate; and
   cleaning the process substrate.

6. The method of claim 2, further comprising removing a portion of the surface modifying layer.

7. The method of claim 6, wherein the portion of the surface modifying layer is removed by an etching process or a grinding process.

8. The method of claim 1, wherein the surface modifying layer is disposed on at least a portion of the process substrate when viewed from a plan view, and
   wherein the process substrate comprises a first region on which the surface modifying layer is disposed and a second region on which the surface modifying layer is not disposed.

9. The method of claim 8, wherein the second region is disposed along an edge of the process substrate.

10. The method of claim 8, wherein the first region is disposed on a portion of an edge of the process substrate.

11. The method of claim 8, wherein the first region passes through a center of the process substrate and extends in a direction parallel to a side of the process substrate.

12. A method of manufacturing a device substrate, the method comprising:
   forming a surface modifying layer on a process substrate, wherein the surface modifying layer has a hydrophobicity different from a hydrophobicity of the process substrate;
   disposing the process substrate on a carrier substrate, wherein the surface modifying layer is disposed between the process substrate and the carrier substrate;
   forming a device on the process substrate; and
   separating the process substrate from the carrier substrate,
   wherein the hydrophobicity of the surface modifying layer is greater than the hydrophobicity of the process substrate, and
   wherein the surface modifying layer includes a metal oxide.

13. The method of claim 12, wherein the metal oxide includes indium-zinc oxide (IZO), indium-tin oxide (ITO), indium-tin-zinc oxide (ITZO), or germanium-zinc oxide (GZO).

14. A method of manufacturing a device substrate, the method comprising:
- forming a surface modifying layer on a process substrate, wherein the surface modifying layer has a hydrophobicity different from a hydrophobicity of the process substrate;
- disposing the process substrate on a carrier substrate, wherein the surface modifying layer is disposed between the process substrate and the carrier substrate;
- forming a device on the process substrate; and
- separating the process substrate from the carrier substrate,
- wherein the hydrophobicity of the surface modifying layer is greater than the hydrophobicity of the process substrate, and
- wherein the surface modifying layer comprises:
- a silane compound layer disposed on the process substrate, wherein the silane compound layer includes a silane compound; and
- a metal oxide layer disposed between the process substrate and the silane compound layer, wherein the metal oxide layer includes a metal oxide.

15. The method of claim 14, wherein the silane compound includes hexamethyldisiloxane (HMDS).

16. The method of claim 14, wherein the metal oxide includes indium-zinc oxide (IZO), indium-tin oxide (ITO), indium-tin-zinc oxide (ITZO), or germanium-zinc oxide (GZO).

17. A method of manufacturing a device substrate, the method comprising:
- forming a surface modifying layer on a process substrate, wherein a hydrophobicity of the surface modifying layer is greater than a hydrophobicity of the process substrate, and wherein the surface modifying layer comprises a silane compound layer comprising a silane compound disposed on the process substrate, and a metal oxide layer comprising a metal oxide disposed between the process substrate and the silane compound layer;
- disposing the process substrate on a carrier substrate, wherein the surface modifying layer is disposed between the process substrate and the carrier substrate;
- forming a device on the process substrate; and
- separating the process substrate from the carrier substrate.

18. The method of claim 17, wherein the silane compound includes hexamethyldisiloxane (HMDS).

19. The method of claim 17, wherein the metal oxide includes indium-zinc oxide (IZO), indium-tin oxide (ITO), indium-tin-zinc oxide (ITZO), or germanium-zinc oxide (GZO).

20. The method of claim 17, wherein forming the surface modifying layer comprises:
- forming a self-assembled monolayer on the process substrate; and
- cleaning the process substrate.

21. The method of claim 17, wherein the process substrate comprises a first region on which the surface modifying layer is disposed and a second region on which the surface modifying layer is not disposed.

22. The method of claim 21, wherein the second region is disposed along an edge of the process substrate.

23. The method of claim 21, wherein the first region is disposed on a portion of an edge of the process substrate.

24. The method of claim 21, wherein the first region passes through a center of the process substrate and extends in a direction parallel to a side of the process substrate.

25. The method of claim 17, further comprising removing a portion of the surface modifying layer.

26. The method of claim 25, wherein the portion of the surface modifying layer is removed by an etching process or a grinding process.

* * * * *